United States Patent
Kawai et al.

(10) Patent No.: US 7,879,175 B2
(45) Date of Patent: Feb. 1, 2011

(54) METHOD FOR MANUFACTURING PYROLYTIC BORON NITRIDE COMPOSITE SUBSTRATE

(75) Inventors: Makoto Kawai, Gunma (JP); Yoshihiro Kubota, Gunma (JP); Atsuo Ito, Gunma (JP); Koichi Tanaka, Gunma (JP); Yuuji Tobisaka, Gunma (JP); Shoji Akiyama, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 322 days.

(21) Appl. No.: 12/078,276

(22) Filed: Mar. 28, 2008

(65) Prior Publication Data
US 2008/0251192 A1 Oct. 16, 2008

(30) Foreign Application Priority Data
Apr. 12, 2007 (JP) .............................. 2007-105154

(51) Int. Cl.
B32B 38/10 (2006.01)
(52) U.S. Cl. ................... 156/247; 156/150; 156/244.23
(58) Field of Classification Search ................. 156/247, 156/150, 233, 244.23
See application file for complete search history.

(56) References Cited
U.S. PATENT DOCUMENTS
4,711,386 A  12/1987  Mizuhara
6,024,988 A * 2/2000  Ream et al. ..................... 426/3
6,048,411 A * 4/2000  Henley et al. ............... 148/33.5
7,094,667 B1  8/2006  Bower
2005/0029594 A1  2/2005  Joly et al.

FOREIGN PATENT DOCUMENTS
JP  B2-3048201  3/2000

OTHER PUBLICATIONS
Auberton-Herve et al., "Smart Cut Technology: Industrial Status of SOI Wafer Production and New Material Developments," *Electrochemical Society Proceedings*, vol. 99, No. 3, pp. 93-106, 1999.
Oct. 6, 2009 Office Action issued in European Patent Application No. 08 006 094.0.

* cited by examiner

*Primary Examiner*—Khanh Nguyen
*Assistant Examiner*—Keith T Aziz
(74) *Attorney, Agent, or Firm*—Oliff & Berridge, PLC

(57) ABSTRACT

Wettability of a PBN material surface with respect to a metal is improved to expand use applications. Hydrogen ions are implanted into a surface of a silicon substrate 10 to form an ion implanted region 11 at a predetermined depth near a surface of the silicon substrate 10, and a plasma treatment or an ozone treatment is performed with respect to a main surface of the silicon substrate 10 for the purpose of surface cleaning or surface activation. The main surfaces of the silicon substrate 10 and a PBN substrate 20 subjected to the surface treatment are appressed against each other to be bonded at a room temperature, and an external impact shock is given to the bonded substrate to mechanically delaminate a silicon film 12 from a bulk 13 of the silicon substrate to be transferred. An obtained PBN composite substrate 30 is diced to form a chip having a desired size, and a refractory metal is metallized on the silicon film 12 side to be connected with a wiring material.

4 Claims, 2 Drawing Sheets

Fig 2
(A) 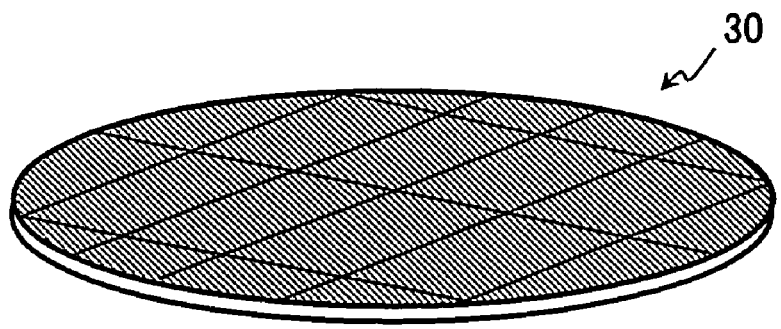
(B) 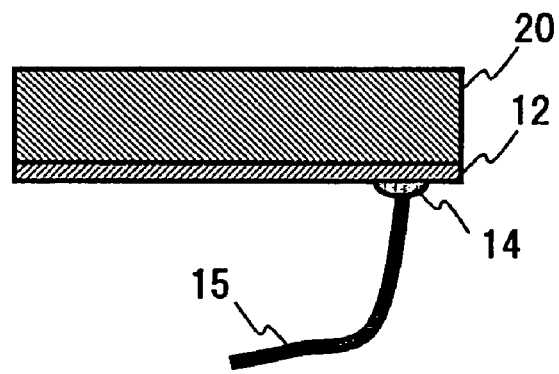

METHOD FOR MANUFACTURING PYROLYTIC BORON NITRIDE COMPOSITE SUBSTRATE

BACKGROUND OF THE INVENTION

1. Field of the Invention

The present invention relates to a method for manufacturing a composite substrate having a silicon thin film on a pyrolytic boron nitride substrate.

2. Description of the Related Art

A pyrolytic boron nitride (PBN) is a boron nitride produced by a CVD method, and it is a ceramics material having excellent features such as a high purity, high heat resistance, high insulation properties, high thermal shock resistance, chemical stability, and others. The PBN is extensively used in, e.g., a component in a heat treatment furnace or a cell used in an MBE method while utilizing such features of the PBN. However, the PBN material has the feature of chemical stability, whereas a surface of this material does not get wet with respect to almost all metals even at a high temperature and reactivity of the PBN material with respect to other materials is poor. Further, it has a drawback that interlayer delamination is apt to occur because the PBN material has a layer structure. Therefore, the PBN material has a problem that metallizing a surface thereof is very difficult and its use applications are limited.

In view of this problem, it is an object of the present invention to improve wettability of a surface of a PBN material with respect to a metal and expands use applications of the PBN material.

SUMMARY OF THE INVENTION

To achieve this object, a method for manufacturing a pyrolytic boron nitride composite substrate according to the present invention comprises: a step A of implanting hydrogen ions into a main surface of a silicon substrate; a step B of performing an activation treatment with respect to a main surface of at least one of a pyrolytic boron nitride substrate and the silicon substrate; a step C of bonding the main surface of the pyrolytic boron nitride substrate to the main surface of the silicon substrate; and a step D of delaminating a silicon thin film from the silicon substrate to form a silicon film on the main surface of the pyrolytic boron nitride substrate.

In the present invention, the step C may be performed with substrate heating at a temperature falling within the range of 100° C. to 300° C. Further, the activation treatment at the step B is, e.g., a plasma treatment or an ozone treatment.

In the present invention, since the silicon film is formed on the surface of the PBN substrate by a bonding method of a low-temperature process, wettability of the PBN substrate surface can be improved, thereby obtaining the PBN composite substrate that can be readily connected with various kinds of circuits.

BRIEF DESCRIPTION OF THE DRAWINGS

FIG. 2 are views showing an example of connecting a wiring material to the PBN composite substrate.

DETAILED DESCRIPTION OF THE PREFERRED EMBODIMENT

Figure 1:
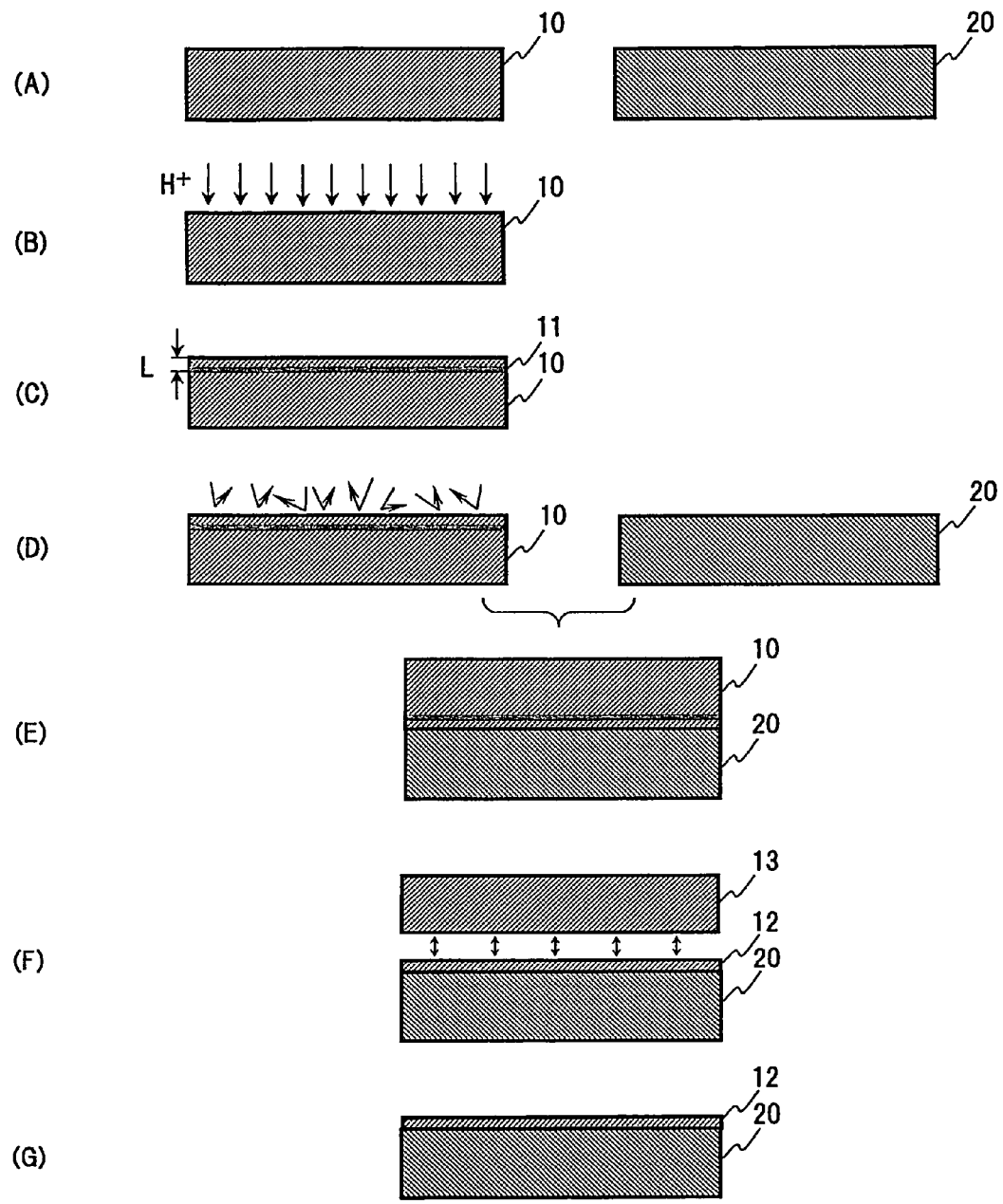
FIG. 1 are views for explaining a process example of a method for manufacturing a PBN composite substrate according to the present invention.

A method for manufacturing a pyrolytic boron nitride composite substrate according to the present invention will now be explained based on an embodiment.

Embodiment

FIG. 1 are views for explaining a process example of a method for manufacturing a pyrolytic boron nitride composite substrate according to the present invention.

A silicon substrate 10 depicted in FIG. 1(A) is a p-type (a specific resistance is approximately 10 Ωcm) substrate with a plane orientation (100) in which boron (B) is doped, and a pyrolytic boron nitride substrate (a PBN substrate) 20 is a substrate flattened by polishing a surface of the PBN substrate produced on a carbon susceptor by a CVD method. It is to be noted that a diameter of the silicon substrate 10 is substantially equal to that of the PBN substrate 20.

First, hydrogen ions are implanted into a surface of the silicon substrate 10 (FIG. 1(B)). This ion implanted surface serves as a bonding surface (a bonded surface) at a later step. Based on this hydrogen ion implantation, an ion implanted region 11 is formed at a predetermined depth (an average ion implantation depth L) near the surface of the silicon substrate 10 (FIG. 1(C)). This ion implanted region 11 becomes a delamination region at a later step.

In regard to a dose amount at the time of hydrogen ion implantation, an appropriate value is selected from the range of, e.g., $1 \times 10^{16}$ to $4 \times 10^{17}$ atoms/cm$^2$ in accordance with a specification of a finally obtained PBN composite substrate and others. Further, the depth of the ion implanted region 11 from the surface of the silicon substrate 10 (the average ion implantation depth L) is controlled by an acceleration voltage at the time of ion implantation, and it is determined in dependent on a thickness of a silicon film to be delaminated. However, for example, the average ion implantation depth L is set to 0.5 μm or below, and the acceleration voltage is set to, e.g., 50 to 100 KeV. It is to be noted that an insulating film such as an oxide film may be formed on the ion implanted surface of the silicon substrate 10 in advance and ion implantation may be carried out through this insulating film, which is usually carried out to suppress channeling of the implanted ions in a process of implanting the ions into an Si crystal.

A main surface of the silicon substrate 10 having the ion implanted region 11 formed thereon in this manner is subjected to a plasma treatment or an ozone treatment for the purpose of surface cleaning or surface activation (FIG. 1(D)). Such a surface treatment is carried out to remove an organic material on the surface serving as the bonding surface or increase an OH group on the surface, thereby activating the surface. It is to be noted that such a surface treatment may be performed with respect to the surface of at least one of the silicon substrate 10 and the PBN substrate 20.

When performing this surface treatment based on the plasma treatment, the silicon substrate and/or the PBN substrate having the surface cleaned by RCA cleaning in advance is mounted on a sample stage in a vacuum chamber, and a plasma gas is introduced into the vacuum chamber to provide a predetermined degree of vacuum. It is to be noted that, as the plasma gas type used in this process, there is an oxygen gas, a hydrogen gas, an argon gas, a mixed gas of these gases, or a mixed gas of the hydrogen gas and a helium gas. After introducing the plasma gas, a high-frequency plasma having a power of approximately 100 W is generated, the treatment is performed with respect to the surface of the silicon substrate and/or the PBN substrate as a plasma treatment target for approximately 5 to 10 seconds, and then the treatment is terminated.

When performing the surface treatment based on the ozone treatment, the silicon substrate and/or the PBN substrate having the cleaned surface is mounted on a sample stage in a chamber having an oxygen containing atmosphere, and a plasma gas such as a nitrogen gas or an argon gas is introduced into this chamber. Then, a high-frequency plasma having a predetermined power is generated, oxygen in the atmosphere is converted into ozone by using this plasma, and the treatment is carried out with respect to the surface of the silicon substrate and/or the PBN substrate as a treatment target for a predetermined time.

The main surfaces of the silicon substrate 10 and the PBN substrate 20 subjected to the surface treatment are appressed against each other to be bonded at a room temperature (FIG. 1(E)). As explained above, since the surface (the bonding surface) of at least one of the silicon substrate 10 and the PBN substrate 20 is activated because of the surface treatment, e.g., the plasma treatment or the ozone treatment, bonding strength that can sufficiently resist mechanical delamination or mechanical polishing at a later step can be obtained even in an appressed (bonded) state at a room temperature. It is to be noted that the substrates may be heated at 100° C. to 300° C. at this bonding step in order to further increase the bonding strength.

The temperature of this heat treatment is set to 100° C. to 300° C. because a lower upper limit temperature is preferable in order to reduce a thermal strain produced between the silicon substrate 10 and the PBN substrate 20 and, on the other hand, heating at approximately 100° C. is required in order to assure an effect of increasing the bonding strength of the silicon substrate 10 and the PBN substrate 20.

A reason that the heat treatment temperature is set to 300° C. or below is a consideration on a thermal expansion coefficient difference between the silicon and the PBN and a strain amount due to this thermal expansion coefficient difference.

When a thickness of the silicon substrate 10 is substantially equal to that of the PBN substrate 20, there is a large difference between the thermal expansion coefficient of the silicon ($2.33 \times 10^{-6}$/K) and the thermal expansion coefficient of the PBN in a c direction (it is $2.6 \times 10^{-6}$/K in an a direction and substantially equal to that of the silicon, but it is $2.2 \times 10^{-5}$/K in the c direction and one digit different from that of the silicon). Therefore, when the heat treatment is carried out at a relatively high temperature, cracks due to a thermal strain may be produced between both the substrates, or delamination may occur on the bonding surface. In an extreme case, the silicon substrate or the PBN substrate may be broken. From such a viewpoint, 300° C. is selected as an upper limit of the heat treatment temperature.

In regard to this point, an SOITEC method (a SmartCut method) known as a method for manufacturing a bonded substrate (an SOI substrate) requires a heat treatment at a relatively high temperature (approximately 500° C. or above) (see, e.g., Japanese Patent No. 3048201 or A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106).), whereas the technique according to the present invention which can obtain the bonded substrate at a low temperature is suitable as the method for manufacturing a PBN composite substrate.

After such a treatment, an external impact shock is given to the bonded substrate to mechanically delaminate the silicon film 12 from a bulk 13 of the silicon substrate to be transferred (FIG. 1(F)). This transference enables obtaining a PBN composite substrate in which the silicon film 12 is formed on the main surface of the PBN substrate 20 (FIG. 1(G)). It is to be noted that various kinds of techniques for giving an impact shock from the outside to delaminate the silicon thin film are present. In this embodiment, however, the impact shock is given by belching out a water jet near the ion implanted region 11 without heating the bonded substrate.

The thus obtained PBN composite substrate 30 is diced to be formed into a chip having a desired size as shown in FIG. 2(A), and a refractory metal is metallized on the silicon film 12 side to be connected with a wiring material (FIG. 2(B)).

As explained above, in the present invention, since the silicon film is formed on the surface of the PBN substrate by the bonding method of a low-temperature process, wettability of the PBN substrate surface can be improved, thereby obtaining the PBN composite substrate which can be readily connected with various kinds of circuits.

The present invention improves wettability of the PBN material surface with respect to a metal and expands use applications of the PBN material.

What is claimed is:

1. A method for manufacturing a pyrolytic boron nitride composite substrate, comprising: a step A of implanting hydrogen ions into a main surface of a silicon substrate; a step B of performing an activation treatment with respect to a main surface of at least one of a pyrolytic boron nitride substrate and the silicon substrate; a step C of bonding the main surface of the pyrolytic boron nitride substrate to the main surface of the silicon substrate; and a step D of delaminating a silicon thin film from the silicon substrate to form a silicon film on the main surface of the pyrolytic boron nitride substrate, thereby improving wettability of the pyrolytic boron nitride substrate main surface relative to a pyrolytic boron nitride substrate surface without a silicon film.

2. The method for manufacturing a pyrolytic boron nitride composite substrate according to claim 1, wherein the step C is performed with substrate heating at a temperature falling within the range of 100° C. to 300° C.

3. The method for manufacturing a pyrolytic boron nitride composite substrate according to claim 1, wherein the activation treatment at the step B is at least one of a plasma treatment and an ozone treatment.

4. The method for manufacturing a pyrolytic boron nitride composite substrate according to claim 2, wherein the activation treatment at the step B is at least one of a plasma treatment and an ozone treatment.

* * * * *